US008871628B2

(12) United States Patent
Lee

(10) Patent No.: US 8,871,628 B2
(45) Date of Patent: Oct. 28, 2014

(54) ELECTRODE STRUCTURE, DEVICE COMPRISING THE SAME AND METHOD FOR FORMING ELECTRODE STRUCTURE

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 14 days.

(21) Appl. No.: 12/689,927

(22) Filed: Jan. 19, 2010

(65) Prior Publication Data

US 2010/0181566 A1    Jul. 22, 2010

Related U.S. Application Data

(60) Provisional application No. 61/146,161, filed on Jan. 21, 2009.

(51) Int. Cl.
| | |
|---|---|
| H01L 29/22 | (2006.01) |
| H01L 21/02 | (2006.01) |
| H01L 31/0224 | (2006.01) |
| H01L 31/078 | (2012.01) |
| H01L 31/18 | (2006.01) |
| H01L 31/075 | (2012.01) |

(52) U.S. Cl.
CPC .... *H01L 21/02554* (2013.01); *H01L 21/02565* (2013.01); *H01L 21/02576* (2013.01); *H01L 21/02579* (2013.01); *H01L 21/0262* (2013.01); *H01L 31/022466* (2013.01); *H01L 31/078* (2013.01); *H01L 31/1884* (2013.01); *H01L 31/075* (2013.01); *Y02E 10/50* (2013.01)
USPC ............... 438/609; 438/57; 438/85; 438/104; 438/584; 438/608

(58) Field of Classification Search
USPC ................................. 438/463, 464
See application file for complete search history.

(56) References Cited

U.S. PATENT DOCUMENTS

| 3,896,244 A | 7/1975 | Ellis et al. |
| 4,891,247 A | 1/1990 | Shamshoian |

(Continued)

FOREIGN PATENT DOCUMENTS

| CN | 1436602 A | 8/2003 |
| EP | 0188208 A2 | 7/1986 |

(Continued)

OTHER PUBLICATIONS

PCT Written Opinion, PCT Application No. PCT/KR2010/001076, Sep. 27, 2010, 8 pages.

(Continued)

*Primary Examiner* — Colleen A Matthews
*Assistant Examiner* — William Harriston
(74) *Attorney, Agent, or Firm* — Fenwick & West LLP

(57) ABSTRACT

An electrode structure comprises a semiconductor junction comprising an n-type semiconductor layer and a p-type semiconductor layer; a hole exnihilation layer on the p-type semiconductor layer; and a transparent electrode layer on the hole exnihilation layer. The electrode structure further comprises a conductive layer between the hole exnihilation layer and the transparent electrode layer. In the electrode structure, one or more of the hole exnihilation layer, the conductive layer and the transparent electrode layer may be formed by an atomic layer deposition. In the electrode structure, a transparent electrode formed of a degenerated n-type oxide semiconductor does not come in direct contact with a p-type semiconductor, and thus, annihilation or recombination of holes generated in the p-type semiconductor can be reduced, which increases the carrier generation efficiency. Further, the electric conductivity of the transparent electrode is increased by the conductive layer, which improves electrical characteristics of a device.

11 Claims, 9 Drawing Sheets

(56) References Cited

U.S. PATENT DOCUMENTS

| | | |
|---|---|---|
| 5,120,568 A | 6/1992 | Schuurmans et al. |
| 5,286,295 A | 2/1994 | Sauvinet et al. |
| 5,300,189 A | 4/1994 | Kokaku et al. |
| 5,368,897 A | 11/1994 | Kurihara et al. |
| 5,549,780 A | 8/1996 | Koinuma et al. |
| 5,560,777 A | 10/1996 | Ahn |
| 5,565,249 A | 10/1996 | Kurihara et al. |
| 5,578,130 A | 11/1996 | Hayashi et al. |
| 5,665,640 A | 9/1997 | Foster et al. |
| 5,711,814 A | 1/1998 | Mori |
| 5,820,947 A | 10/1998 | Itoh |
| 5,863,337 A | 1/1999 | Neuman et al. |
| 5,951,771 A | 9/1999 | Raney et al. |
| 6,051,150 A | 4/2000 | Miyakawa |
| 6,079,353 A | 6/2000 | Leksell et al. |
| 6,099,974 A | 8/2000 | Lenling |
| 6,143,077 A | 11/2000 | Ikeda et al. |
| 6,319,615 B1 | 11/2001 | Jansen |
| 6,354,109 B1 | 3/2002 | Boire et al. |
| 6,406,590 B1 | 6/2002 | Ebata et al. |
| 6,416,822 B1 | 7/2002 | Chiang et al. |
| 6,424,091 B1 | 7/2002 | Sawada et al. |
| 6,435,428 B2 | 8/2002 | Kim et al. |
| 6,521,048 B2 | 2/2003 | Miller et al. |
| 6,641,673 B2 | 11/2003 | Yang |
| 6,656,831 B1 | 12/2003 | Lee et al. |
| 6,730,614 B1 | 5/2004 | Lim et al. |
| 6,972,055 B2 | 12/2005 | Sferlazzo |
| 6,997,371 B2 | 2/2006 | Shabtay |
| 7,886,688 B2 | 2/2011 | Takeuchi et al. |
| 7,943,527 B2 | 5/2011 | Kumar et al. |
| 8,257,799 B2 | 9/2012 | Lee |
| 8,328,982 B1 | 12/2012 | Babayan et al. |
| 2001/0047759 A1 | 12/2001 | Matsui et al. |
| 2002/0092616 A1 | 7/2002 | Kim |
| 2002/0100418 A1 | 8/2002 | Sandhu et al. |
| 2002/0112819 A1 | 8/2002 | Kamarehi et al. |
| 2002/0197864 A1 | 12/2002 | Sneh |
| 2003/0072881 A1 | 4/2003 | Yang et al. |
| 2003/0143328 A1 | 7/2003 | Chen et al. |
| 2003/0214043 A1 | 11/2003 | Saitoh et al. |
| 2004/0052972 A1 | 3/2004 | Schmitt |
| 2004/0067641 A1 | 4/2004 | Yudovsky |
| 2004/0083967 A1 | 5/2004 | Yuda et al. |
| 2004/0129212 A1 | 7/2004 | Gadgil et al. |
| 2004/0171280 A1 | 9/2004 | Conley et al. |
| 2004/0224527 A1 | 11/2004 | Sarigiannis et al. |
| 2004/0247787 A1 | 12/2004 | Mackie et al. |
| 2004/0261946 A1 | 12/2004 | Endoh et al. |
| 2005/0016457 A1 | 1/2005 | Kawasaki et al. |
| 2005/0064207 A1 | 3/2005 | Senzaki et al. |
| 2005/0064236 A1 | 3/2005 | Lim et al. |
| 2005/0106094 A1 | 5/2005 | Kondo |
| 2005/0183768 A1* | 8/2005 | Roscheisen et al. .......... 136/263 |
| 2006/0019033 A1 | 1/2006 | Muthukrishnan et al. |
| 2006/0068519 A1 | 3/2006 | Dunbar et al. |
| 2006/0183301 A1 | 8/2006 | Yeom et al. |
| 2006/0211243 A1 | 9/2006 | Ishizaka et al. |
| 2006/0213441 A1 | 9/2006 | Kobrin et al. |
| 2006/0231954 A1* | 10/2006 | Yan et al. .................... 257/744 |
| 2006/0237399 A1 | 10/2006 | Horner-Richardson et al. |
| 2006/0240665 A1 | 10/2006 | Kang et al. |
| 2007/0082500 A1 | 4/2007 | Norman et al. |
| 2007/0145023 A1 | 6/2007 | Holber et al. |
| 2007/0181177 A9* | 8/2007 | Sager et al. .................... 136/263 |
| 2007/0224348 A1 | 9/2007 | Dickey et al. |
| 2007/0237699 A1 | 10/2007 | Clark |
| 2007/0243325 A1 | 10/2007 | Sneh |
| 2007/0264488 A1* | 11/2007 | Lee ............... 428/323 |
| 2007/0281082 A1 | 12/2007 | Mokhlesi et al. |
| 2007/0281089 A1 | 12/2007 | Heller et al. |
| 2008/0026162 A1 | 1/2008 | Dickey et al. |
| 2008/0075881 A1 | 3/2008 | Won et al. |
| 2008/0092953 A1* | 4/2008 | Lee ............... 136/261 |
| 2008/0106202 A1 | 5/2008 | Du et al. |
| 2008/0241387 A1 | 10/2008 | Keto |
| 2008/0260963 A1 | 10/2008 | Yoon et al. |
| 2009/0017190 A1 | 1/2009 | Sferlazzo et al. |
| 2009/0044661 A1 | 2/2009 | Li et al. |
| 2009/0068849 A1 | 3/2009 | Endo et al. |
| 2009/0102385 A1 | 4/2009 | Wi |
| 2009/0130858 A1 | 5/2009 | Levy |
| 2009/0133714 A1 | 5/2009 | Yamazaki et al. |
| 2009/0165715 A1 | 7/2009 | Oh |
| 2009/0170345 A1 | 7/2009 | Akae et al. |
| 2009/0197406 A1 | 8/2009 | Cao et al. |
| 2009/0291211 A1 | 11/2009 | Ryu et al. |
| 2010/0037820 A1 | 2/2010 | Lee |
| 2010/0037824 A1 | 2/2010 | Lee |
| 2010/0055347 A1 | 3/2010 | Kato et al. |
| 2010/0064971 A1 | 3/2010 | Lee |
| 2010/0068413 A1 | 3/2010 | Lee |
| 2010/0124618 A1 | 5/2010 | Kobayashi et al. |
| 2010/0189900 A1 | 7/2010 | Dickey et al. |
| 2010/0215871 A1 | 8/2010 | Lee |
| 2010/0255625 A1 | 10/2010 | De Vries |
| 2010/0304047 A1 | 12/2010 | Yang et al. |
| 2010/0310771 A1 | 12/2010 | Lee |
| 2011/0070380 A1 | 3/2011 | Shero et al. |
| 2012/0021252 A1 | 1/2012 | Lee |
| 2012/0094149 A1 | 4/2012 | Lee |
| 2012/0114877 A1 | 5/2012 | Lee |
| 2012/0125258 A1 | 5/2012 | Lee |
| 2012/0207948 A1 | 8/2012 | Lee |
| 2012/0213945 A1 | 8/2012 | Lee |
| 2012/0225204 A1 | 9/2012 | Yudovsky |
| 2012/0301632 A1 | 11/2012 | Lee |

FOREIGN PATENT DOCUMENTS

| | | |
|---|---|---|
| EP | 0499524 A1 | 2/1992 |
| FR | 2736632 A1 | 1/1997 |
| JP | S62-081018 A | 4/1987 |
| JP | H01-096924 A | 4/1989 |
| JP | 1-161835 A | 6/1989 |
| JP | H01-223724 A | 9/1989 |
| JP | H2-187018 A | 7/1990 |
| JP | H04-092414 A | 3/1992 |
| JP | H09-064000 A | 3/1997 |
| JP | 09-167757 A | 6/1997 |
| JP | 09-199738 A | 7/1997 |
| JP | 11-092943 A | 4/1999 |
| JP | 2001-357780 A | 12/2001 |
| JP | 2002-018276 A | 1/2002 |
| JP | 2003-049272 A | 2/2003 |
| JP | 2003-073835 A | 3/2003 |
| JP | 2003-174019 A | 6/2003 |
| JP | 2003-324070 | 11/2003 |
| JP | 2004-010949 A | 1/2004 |
| JP | 2004-091837 A | 3/2004 |
| JP | 2005-089781 A | 4/2005 |
| JP | 2005-116898 | 4/2005 |
| JP | 2005-347245 A | 5/2005 |
| JP | 2006-236697 A | 9/2006 |
| JP | 2007-019460 A | 1/2007 |
| JP | 2007-191792 A | 8/2007 |
| JP | 2007-266093 A | 10/2007 |
| JP | 2008-108895 A | 5/2008 |
| KR | 100175011 B1 | 11/1998 |
| KR | 10-2001-0040561 | 5/2001 |
| KR | 10-2002-0078804 | 10/2002 |
| KR | 10-2002-0083564 A | 11/2002 |
| KR | 10-0631972 | 8/2003 |
| KR | 10-2004-0042209 A | 5/2004 |
| KR | 10-2005-0015931 A | 2/2005 |
| KR | 10-0542736 | 1/2006 |
| KR | 10-2006-0117607 | 11/2006 |
| KR | 10-0673211 B1 | 1/2007 |
| KR | 10-2007-0051332 A | 5/2007 |
| KR | 10-2007-0076955 A | 7/2007 |
| KR | 10-2007-0096770 A | 10/2007 |
| KR | 10-2007-0101127 A | 10/2007 |
| KR | 10-2007-0101360 A | 10/2007 |
| KR | 10-0771926 A | 10/2007 |

(56) References Cited

FOREIGN PATENT DOCUMENTS

| KR | 10-2008-0067042 A | 7/2008 |
|---|---|---|
| WO | WO 2006/054854 A1 | 5/2006 |
| WO | WO 2007/134322 A2 | 11/2007 |
| WO | WO 2008/130369 A1 | 10/2008 |
| WO | WO 2009/031886 A2 | 3/2009 |
| WO | WO 2010/138102 A1 | 12/2010 |

OTHER PUBLICATIONS

U.S. Appl. No. 13/185,793, filed Jul. 19, 2011, Inventor: Sang In Lee.
U.S. Appl. No. 13/273,076, filed Oct. 13, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
PCT International Search Report and Written Opinion, PCT Application No. PCT/US2011/056285, Mar. 8, 2012, 11 pages.
PCT International Search Report and Written Opinion, PCT Application No. PCT/US11/58552, Mar. 14, 2012, 12 pages.
PCT International Search Report and Written Opinion, PCT Application No. PCT/US2011/060474, Mar. 22, 2012, 12 pages.
PCT International Search Report and Written Opinion, PCT Application No. PCT/US11/44470, Dec. 7, 2011, 13 pages.
Dameron, A.A. et al., "Molecular Layer Deposition of Alucone Polymer Films Using Trimethylaluminum and Ethylene Glycol," Chem. Mater., 2008, pp. 3315-3326, vol. 20.
PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
PCT International Search Report and Written Opinion, PCT Application No. PCT/US12/25095, Aug. 3, 2012, 18 pages.
U.S. Appl. No. 13/369,717, filed Feb. 9, 2012, Inventor: Sang In Lee.
U.S. Appl. No. 13/397,590, filed Feb. 15, 2012, Inventor: Sang In Lee.
European Extended Search Report, European Application No. 10786646.9, Nov. 29, 2012, 17 pages.
Choi, J. M. et al., "Ultraviolet Enhanced Si-Photodetector Using p-NiO Films," Applied Surface Science, May 15, 2005, pp. 435-438, vol. 244, No. 1-4.
European Extended Search Report, European Application No. 10733634.9, Jan. 30, 2013, 5 pages.
He, G. et al., "Metal-Organic Chemical Vapor Deposition of Aluminum Oxynitride from Propylamine-Dimethylaluminum Hydride and Oxygen: Growth Mode Dependence and Performance Optimization," Journal of Materials Chemistry, 2012, pp. 7468-7477, vol. 22.
Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.
Kymakis, E. et al., "Bi-Layer Photovoltaic Devices with PPQ as the Electron Acceptor Layer," Solar Energy Materials & Solar Cells, Jul. 24, 2006, pp. 1705-1714, vol. 90, No. 12.
Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.
Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007, 6 pages.
Zhu, M. et al., "Aluminum Oxynitride Interfacial Passivation Layer for High-Permittivity Gate Dielectric Stack on Gallium Arsenide," Applied Physics Letters, 202903, 2006, pp. 1-3, vol. 89.
European Examination Report, European Patent Application No. 10786646.9, Oct. 24, 2013, 5 pages.
Maydannik, P.S. et al., "An Atomic Layer Deposition Process for Moving Flexible Substrates," Chemical Engineering Journal, 2011, pp. 345-349, vol. 171.
Taiwan Office Action, Taiwan Application No. 100126066, Oct. 8, 2013, 14 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.

* cited by examiner

ELECTRODE STRUCTURE, DEVICE COMPRISING THE SAME AND METHOD FOR FORMING ELECTRODE STRUCTURE

CROSS-REFERENCE TO RELATED APPLICATION

This application claims priority from and the benefit under 35 U.S.C. §119(e) of U.S. patent application No. 61/146,161, filed on Jan. 21, 2009, which is incorporated by reference herein in its entirety.

BACKGROUND

1. Field of the Invention

Embodiments relate to an electrode structure for a solar cell having a transparent electrode.

2. Description of the Related Art

Some thin-film type solar cells include a transparent electrode, a p-n junction and a metal film. The transparent electrode is generally made of a transparent material that allows sunlight to pass through and has excellent electric conductivity characteristics. The p-n junction is formed of a p-type semiconductor material and an n-type semiconductor material. The p-n junction may be in the form of a p-i-n junction that includes an undoped layer of intrinsic semiconductor material sandwiched between a layer of p-type semiconductor material and a layer of n-type semiconductor material. The metal film is in contact with the semiconductor materials to convey current generated by exposing the solar cell to the sunlight.

FIGS. 1A through 1D are schematic views of conventional thin-film type solar cells. As illustrated in FIGS. 1A through 1D, the thin-film type solar cells may be in the form of a basic structure where a transparent electrode, a semiconductor junction, and a back metal contact are stacked on top of each other. The thin-film type solar cell may further include an anti-reflection coating, cover glass or the like. The semiconductor junction generally is a p-n junction, a p-i-n junction or any combinations thereof. The transparent electrode is often formed of a transparent conducting oxide (TCO).

In order to form the back metal contact, a metal film such as molybdenum (Mo), nickel (Ni) or aluminum (Al) is first deposited on a substrate such as a float glass or a metal foil. Then, an amorphous, micro-crystalline or poly-crystalline semiconductor material is deposited by chemical vapor deposition (CVD) (e.g., thermal CVD or plasma-enhanced CVD) or physical vapor deposition (PVD) (e.g., sputtering or evaporation). The back metal contact may form a Schottky contact between a metal and an n-type semiconductor material.

FIG. 1E is a schematic view of a conventional bulk type solar cell. In the bulk type solar cell uses a polycrystalline or single crystalline wafer. The wafer is obtained from an ingot doped with boron (B). Thus, an n-p junction type structure is formed by doping phosphorous (P) into a p-type semiconductor. In order to form a back metal contact, a p-p+ junction layer is made by performing a heavy doping process with respect to the back of the structure. The back metal contact forms a back surface field. Accordingly, the structure comes in ohmic contact with a metal film formed of Al, Mo or the like.

Visible light spectrum takes up about 40% or more of the energy of the sunlight. Therefore, a solar cell may have a band gap of about 3 electron volts (eV) so as to have transparency in the visual region. The solar cell may have a relatively high electric conductivity so that current is generated by the movement of electrons or holes. Thus, a degenerated n-type oxide transparent semiconductor such as indium tin oxide (ITO), zinc oxide doped with aluminum (ZnO:Al) or tin oxide doped with fluorine ($SnO_2$:F) may be used as a transparent electrode of the solar cell. The ZnO has a band gap of about 3.4 eV. The ZnO also has advantageous characteristics of relatively high transmittance, relatively high electric conductivity in the visual region, and low price. Hence, the ZnO may be used as the substitute of an ITO film. In order to improve the electric conductivity, a degenerated n-type oxide transparent semiconductor may be formed by doping Al into the ZnO.

In a thin-film type solar cell or display device, a semiconductor junction layer, a metal layer and a transparent electrode film are formed by deposition, and hence, a Schottky junction can be used. In the structure in which an ITO or ZnO:Al film is formed adjacent to the p-layer of a p-n junction or a p-i-n junction, holes generated by sunlight is annihilated in a transparent electrode layer because the transparent electrode layer is an n-type oxide semiconductor. Thee annihilation of the holes tends to lower the efficiency associated with generating current or carriers (e.g., electrons or holes) by exposing the solar cell or the display device to the sunlight.

Furthermore, a thin film obtained by CVD or PVD may have degraded physical, chemical and electrical properties due to defects, impurities, defects of crystalline structure, imperfect grain boundary, or the like. The degraded properties is detrimental to generation and diffusion of carrier due to the sunlight, and results in poor performance associated with drift and the like.

As a result, the thin-film type solar cells generally tend to exhibit lower short circuit current and lower efficiency compared to the bulk type solar cell and are more susceptible to light induced aging.

SUMMARY OF THE INVENTION

Embodiments provide an electrode structure, device and method for increasing carrier generation efficiency by preventing hole annihilation and formation of imperfection in a thin film.

According to an exemplary embodiment, the electrode structure includes a semiconductor junction having an n-type semiconductor layer and a p-type semiconductor layer; a hole exnihilation layer on the p-type semiconductor layer; and a transparent electrode layer on the hole exnihilation layer.

The electrode structure may further include a conductive layer between the hole exnihilation layer and the transparent electrode layer.

In the electrode structure, the hole exnihilation layer may include a p-type oxide semiconductor. The hole exnihilation layer may include a photoactive material in addition to the p-type oxide semiconductor. In the hole exnihilation layer, the p-type oxide semiconductor and the photoactive material may be formed as individual layers, respectively.

In an exemplary embodiment, a device including the electrode structure is provided.

In an exemplary embodiment, a method for forming an electrode structure is provided. The method includes preparing a semiconductor junction including an n-type semiconductor layer and a p-type semiconductor layer; forming a hole exnihilation layer on the p-type semiconductor layer; and forming a transparent electrode layer on the hole exnihilation layer.

The method for forming the electrode structure may further include forming a conductive layer on the hole exnihilation layer. The transparent electrode layer may be formed on the conductive layer.

In the method for forming the electrode structure, one or more of the hole exnihilation layer, the conductive layer and the transparent electrode layer may be formed by atomic layer deposition (ALD).

BRIEF DESCRIPTION OF THE DRAWINGS

The above and other aspects, features and advantages of the present invention will become apparent from the following description of preferred exemplary embodiments given in conjunction with the accompanying drawings.

DETAILED DESCRIPTION OF THE INVENTION

Hereinafter, exemplary embodiments of the present invention will be described in detail with reference to the accompanying drawings. However, the present invention is not limited the following exemplary embodiments.

Figure 1A:
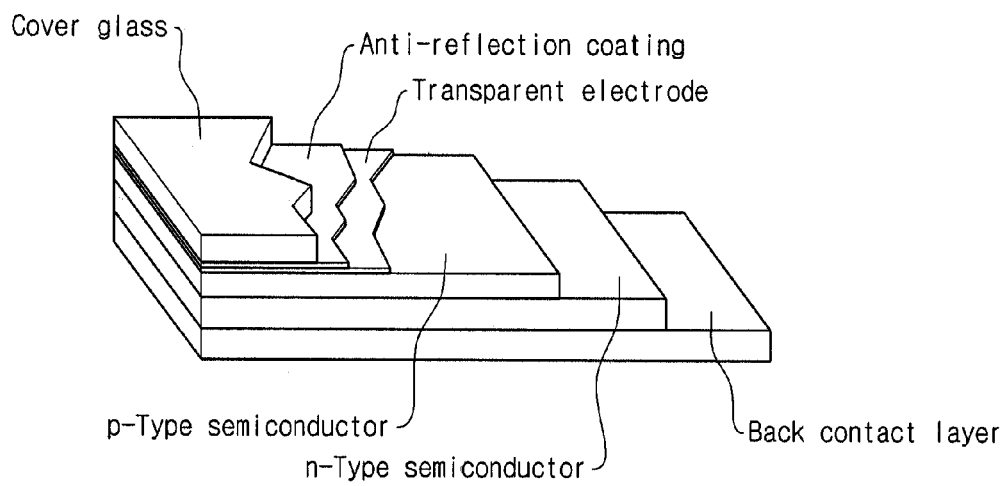
FIGS. 1A to 1E are schematic views of conventional solar cells.
Figure 1B:
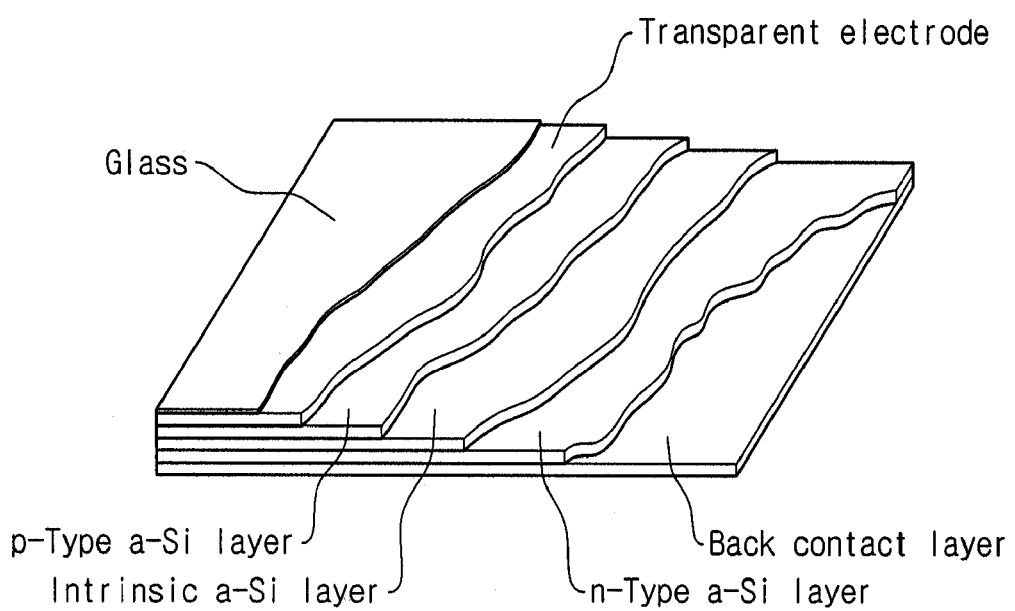
Figure 1C:
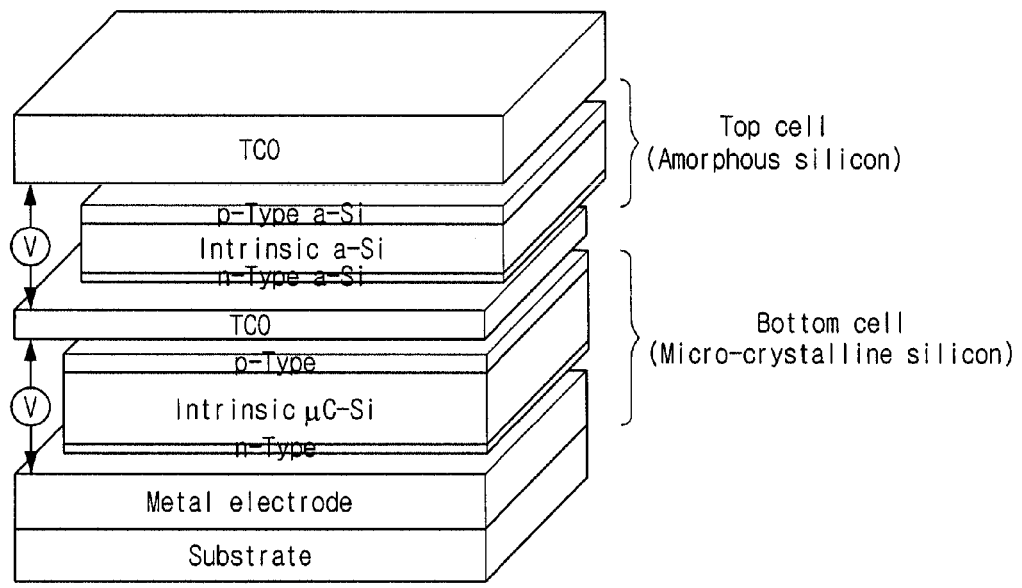
Figure 1D:
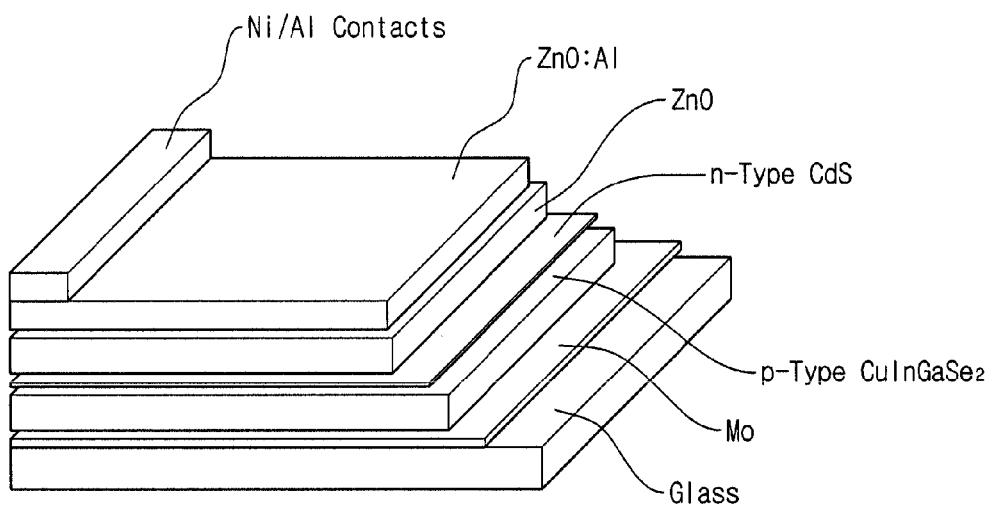
Figure 1E:
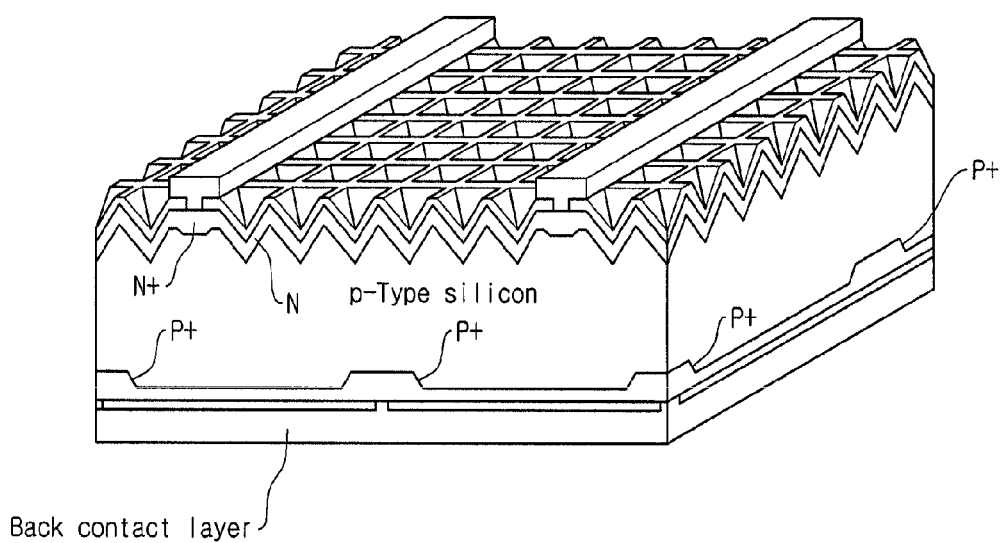
Figure 2:
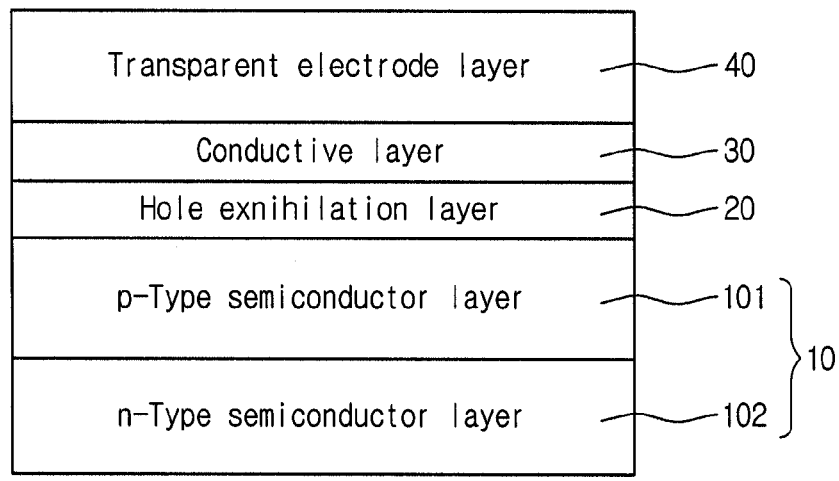
FIG. 2 is a schematic sectional view of an electrode structure according to an exemplary embodiment.

FIG. 2 is a schematic sectional view of an electrode structure according to an exemplary embodiment. The electrode structure of FIG. 2 includes a semiconductor junction 10, a hole exnihilation layer 20 and a transparent electrode layer 40. The semiconductor junction 10 may include a p-type semiconductor layer 101 and an n-type semiconductor layer 102. For example, the semiconductor junction 10 may be a p-n junction in which one p-type semiconductor layer 101 is joined with one n-type semiconductor layer 102. Alternatively, the semiconductor junction 10 may be a p-i-n junction in which an intrinsic semiconductor layer (not shown) is further interposed between the p-type and n-type semiconductor layers 101 and 102. As a further alternative embodiment, the semiconductor junction 10 may have a structure comprising one or more p-type semiconductor layers and one or more n-type semiconductor layers, such as p-i-n-i-p, p-n-p-n or p-n-p. The structure of the electrode structure described herein is merely illustrative and is not in any way limiting.

The hole exnihilation layer 20 may be in contact with the p-type semiconductor layer 101 of the semiconductor junction 10 or positioned adjacent to the p-type semiconductor layer 101 of the semiconductor junction 10. The hole exnihilation layer 20 is a layer for preventing holes generated in the p-type semiconductor layer 101 from being annihilated or recombined in the transparent electrode layer 40. In an exemplary embodiment, the hole exnihilation layer 20 may be formed by atomic layer deposition (ALD) to have a thickness of about 0.1 nm to about 10 nm. The hole exnihilation layer 20 may include a p-type oxide semiconductor.

In an exemplary embodiment, the hole exnihilation layer 20 is configured as a single layer formed of a p-type oxide semiconductor. For example, the hole exnihilation layer 20 may be formed of nickel oxide (NiO), cobalt oxide (CoO), copper oxide ($Cu_2O$), copper aluminum oxide ($CuAlO_2$), copper indium oxide ($CuInO_2$) or other suitable materials. The NiO is a p-type oxide semiconductor that has a band gap of about 3.6 electron volts (eV) to about 4 eV. The NiO also transmits visible light. The $Cu_2O$, $CuAlO_2$, $CuInO_2$ and the like also have properties similar to those of the NiO.

In another exemplary embodiment, the hole exnihilation layer 20 is configured as a mixed layer in which a photoactive material is added to a p-type oxide semiconductor. For example, the hole exnihilation layer 20 may be formed of a material prepared by adding the aforementioned p-type oxide semiconductor such as NiO, CoO $Cu_2O$, $CuAlO_2$ and $CuInO_2$ to titanium oxide ($TiO_2$) or other suitable photoactive materials. The ratio between the p-type semiconductor layer and the photoactive material may be such that the hole exnihilation layer in its entirety exhibits p-type semiconductor properties, as described below in detail with reference to FIG. 6.

In still another exemplary embodiment, the hole exnihilation layer 20 is configured as a composite layer in which the p-type oxide semiconductor and the photoactive material are formed as separate layers, respectively.

Figure 3:
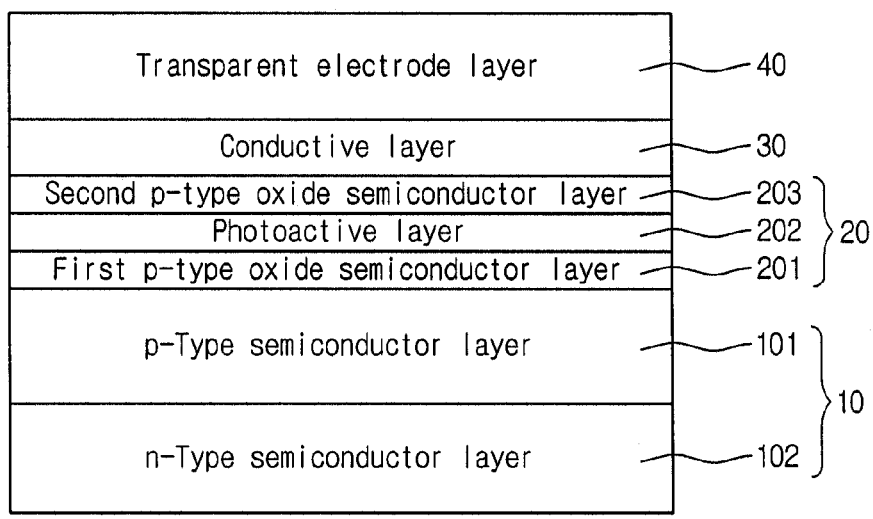
FIG. 3 is a schematic sectional view of an electrode structure according to another exemplary embodiment.

FIG. 3 is a schematic sectional view of an electrode structure having a hole exnihilation layer 20 configured as a composite layer. The hole exnihilation layer 20 of FIG. 3 may include a first p-type semiconductor layer 201, a photoactive layer 202 and a second p-type semiconductor layer 203. The first p-type semiconductor layer 201 may be placed on the p-type semiconductor layer 101 of the semiconductor junction 10. The photoactive layer 202 may be interposed between the first and second p-type semiconductor layers 201 and 203. The first and second p-type semiconductor layers 201 and 203 may be formed of NiO, CoO $Cu_2O$, $CuAlO_2$, $CuInO_2$ or other suitable p-type oxide semiconductors. The first and second p-type semiconductor layers 201 and 203 may be formed of the same material or each of these layers may be formed of different materials. The photoactive layer 202 may be formed of $TiO_2$ or other suitable photoactive materials.

In an exemplary embodiment, each of the first and second p-type semiconductor layers 201 and 203 is formed by ALD to have a thickness of about 0.1 nm to about 10 nm. The thickness ratio between the first and second p-type semiconductor layers 201 and 203, and the photoactive layer 202 may be such that the exnihilation layer 20 in its entirety exhibits p-type semiconductor properties.

The composite layer structure illustrated in FIG. 3 is only illustrative. In another exemplary embodiment, the hole exnihilation layer 20 may be configured as a composite layer comprising one p-type oxide semiconductor layer and one photoactive layer or a composite layer with a different structure including at least one p-type oxide semiconductor layer and at least one photoactive layer. However, in the hole exnihilation layer 20, the layer that comes in contact with the p-type semiconductor layer 101 or positioned adjacent to the p-type semiconductor layer 101 may be formed of a p-type oxide semiconductor. For example, the hole exnihilation layer 20 may be formed into $NiO/TiO_2$, $NiO/TiO_2/NiO$, $NiO/TiO_2/CoO$ or other suitable structures.

In an exemplary embodiment, the electrode structure includes a conductive layer 30. The conductive layer 30 is stacked on the hole exnihilation layer 20. The conductive layer 30 is a layer for minimizing carrier annihilation and/or recombination and increasing the electric conductivity of the transparent electrode layer 40 on the conductive layer 30. If the electrode structure according to the embodiment is applied to a solar cell, the conductivity of the transparent electrode layer 40 can be increased by the conductive layer 30 without lowering transmittance in the visible light region and degrading electrical properties of carriers generated by sunlight. Further, the conductive layer 30 reflects a portion of infrared light, which reduces the heating up of the semiconductor junction 10 caused by absorbing infrared light.

The conductive layer 30 may be formed of metal or other suitable conductive materials. For example, the conductive layer 30 may be formed of a transition metal such as nickel (Ni), cobalt (Co), copper (Cu), platinum (Pt), iridium (Ir) or rubidium (Ru). Alternatively, the conductive layer 30 may be formed of aluminum (Al) or an alloy of two or more of the materials listed above. In an exemplary embodiment, the conductive layer 30 may be formed by ALD to have a thickness of about 0.1 nm to about 10 nm.

In an exemplary embodiment, the conductive layer 30 may be formed of a material containing a metal atom, identical to that of the hole exnihilation layer 20. For example, the conductive layer 30 may be formed of Ni, Co, Cu or the like. Even when the conductive layer 30 is oxidized during the process of forming the transparent electrode layer 40 on the conductive layer 30, the oxidized conductive layer 30 becomes a p-type oxide layer such as NiO, CoO, $Cu_2O$, $CuAlO_2$ or $CuInO_2$. Thus, the conductive layer 30 can perform similar functions as the hole exnihilation layer 20.

The transparent electrode layer 40 may be stacked on the conductive layer 30. The transparent electrode layer 40 may be formed of a degenerated n-type oxide semiconductor. For example, the transparent electrode layer 40 is formed of indium tin oxide (ITO) ($In_2O_3$—$SnO_2$), zinc oxide (ZnO), zinc oxide doped with aluminum (ZnO:Al), tin oxide ($SnO_2$), tin oxide doped with fluorine ($SnO_2$:F), $TiO_2$, iridium oxide (IrO2), rubidium oxide ($RuO_2$) or other suitable materials. In an exemplary embodiment, the transparent electrode layer 40 is formed to have a thickness of about 50 nm to about 500 nm.

In the electrode layer according to the above exemplary embodiments, the transparent electrode layer 40 formed of the degenerated n-type semiconductor does not come in direct contact with the p-type semiconductor layer 101 because of the hole exnihilation layer 20 and the conductive layer 30. Hence, it is possible to reduce or prevent annihilation or recombination of holes (generated by the p-type semiconductor layer 101) within the transparent electrode layer 40. The reduced or non-existence of annihilation or recombinant results in increased carrier generation efficiency. Further, the electric conductivity of the transparent electrode may be increased by the conductive layer By applying the electrode structures according to exemplary embodiments to a device (e.g., a solar cell, display device or semiconductor device) with a structure in which a transparent electrode is formed adjacent to a p-type semiconductor, it is possible to maintain high carrier generation efficiency by reducing or preventing hole annihilation and imperfection of a thin film. It is possible to improve electrical characteristics of the device.

FIGS. 4A to 4D are schematic sectional views illustrating a method for forming an electrode structure according to an exemplary embodiment. A semiconductor junction 10 of FIG. 4A includes a p-type semiconductor layer 101 and an n-type semiconductor layer 102. The semiconductor junction 10 may be a p-n junction in which the p-type and n-type semiconductor layers 101 and 102 come in contact with each other. Alternatively, the semiconductor junction 10 may be a junction with a structure including at least one p-type semiconductor layers and at least one n-type semiconductor layer, such as p-i-n, p-n-p or p-i-n-i-p.

Figure 4A:
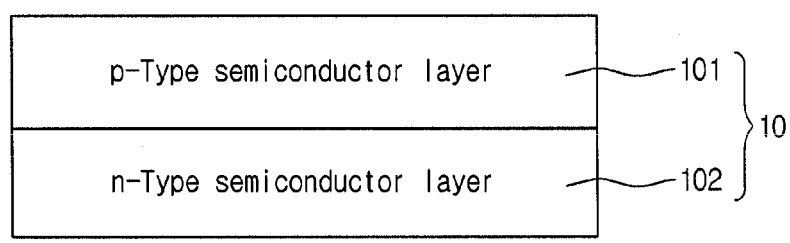
FIGS. 4A to 4D are schematic sectional views illustrating the process of forming an electrode structure, according to an exemplary embodiment.
Figure 4B:
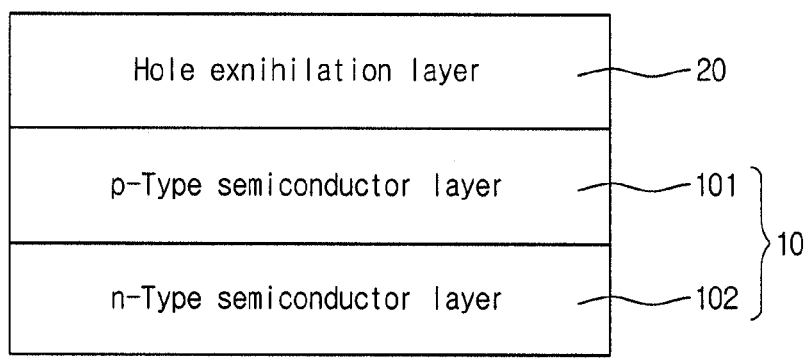

Referring to FIG. 4B, a hole exnihilation layer 30 may be formed on the p-type semiconductor layer 101 of the semiconductor junction 10. The hole exnihilation layer may be a single layer formed of a p-type oxide semiconductor or a mixed layer in which a photoactive material is added to a p-type oxide semiconductor. Alternatively, the hole exnihilation layer 20 may be configured as a composite layer in which the p-type oxide semiconductor and the photoactive material are formed as separate layers, respectively.

In an exemplary embodiment, the hole exnihilation layer 20 may be formed by ALD. Generally, an ALD undergoes four processes: adsorption of source precursors, purge and/or pumping, adsorption of reactant precursors, and purge and/or pumping. The adsorbed source precursors and the adsorbed reactant precursors may be combined to form an atomic layer. Residual substances and physically adsorbed molecules that do not take part in reactions may be removed by the operation of purge and/or pumping.

The ALD may be performed using a showerhead type ALD reactor or other similar ALD reactors. In the showerhead type ALD reactor, source precursors and/or reactant precursors are simultaneously sprayed on the entire surface of a substrate on which an atomic layer is to be formed. Alternatively, the ALD may be performed using a scan type ALD reactor for performing the following processes: injection of source precursors, injection of reactant precursors, purge and/or pumping and the like while a substrate passes through the reactor. The scan type ALD reactor is disclosed, for example, in Korean Patent No. 10-760428, entitled "Vapor Deposition Reactor," which is incorporated by reference herein in its entirety.

Figure 5:
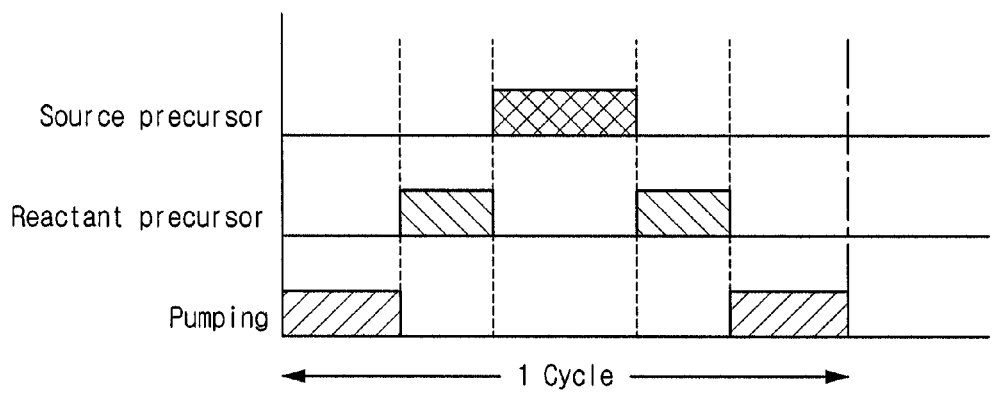
FIG. 5 a timing diagram illustrating an atomic layer deposition process for forming an electrode structure according to an exemplary embodiment.

FIG. 5 a timing diagram illustrating an exemplary ALD process for forming a hole exnihilation layer on a semiconductor junction according to an exemplary embodiment. Although FIG. 5 illustrates an ALD process performed using a scan type ALD reactor, this is merely illustrative. The method for forming an electrode structure is not limited to the process illustrated in FIG. 5 or the process using a reactor with a specific structure.

Referring to FIGS. 4B and 5, a pumping process may be first performed to remove foreign substances adsorbed on the semiconductor junction 10, residual substances generated in a previous process and physically adsorbed molecules. A purge process may be performed together with the pumping process by injecting an inert gas such as argon (Ar) or helium (He) into the semiconductor junction 10.

Subsequently, the semiconductor junction 10 may be exposed to reactant precursors. One or more of $O_2$, $N_2O$, $H_2O$ and $O_3$ may be used as the reactant precursors, or their plasmas ($O_2$-plasma, $N_2O$-plasma and $H_2O$-plasma) or oxygen radicals (O* radical) may be used as the reactant precursors. Plasmas and/or radicals of the precursors containing oxygen atoms may be irradiated onto the surface of the semiconductor junction 10 so that the surface of the semiconductor junction 10 is activated or the hydrophobic surface of the semiconductor junction 10 is converted into a hydrophilic surface. As a result, the deposition speed of a p-type oxide semiconductor can be increased.

Applying plasma directly to the semiconductor junction 10 may have a negative effect on the semiconductor junction 10. Therefore, a remote plasma method, indirect oxygen radical excitation method, an indirect exposure method or similar methods may be used to avoid or alleviate the negative effect. The remote plasma method generates the plasma at a place that is located away from a substrate by about 1 mm or more. The indirect oxygen radical excitation method indirectly excites oxygen atoms by supplying radicals generated by the plasma to precursors that contain oxygen atoms. The indirect exposure method forms an electrode in a direction perpendicular to the surface of the semiconductor junction 10 and then generating plasma in parallel with the surface of the semiconductor junction 10.

Subsequently, the semiconductor junction may be exposed to source precursors. Various materials may be used as the source precursors in accordance with compositions and kinds of materials to be deposited as the hole exnihilation layer 20.

In an exemplary embodiment, when the hole exnihilation layer 20 is formed into a single layer formed of only a p-type oxide semiconductor, the source precursor may include bis (dimethylamino-2-methyl-2-butoxo)nickel; Ni(dmamb)$_2$, Co(dmamb)$_2$, Cu(dmamb) or other suitable materials, depending on the kind of p-type oxide semiconductor.

In another exemplary embodiment, when the hole exnihilation layer 20 is formed into a mixed layer of a p-type oxide semiconductor and a photoactive material, the source precursor may be a mixed material of a first source precursor and a second source precursor. Here, the first source precursor may include Ni(dmamb)$_2$, Co(dmamb)$_2$, Cu(dmamb) or other suitable materials. The second source precursor may include tetra-dimethyl-amino-titanium (TDMAT), tetra-diethyl-amino-titanium (TDEAT), tetra-ethyl-methyl-amino-titanium (TEMAT) or other suitable materials.

The method of applying two kinds of source precursors together as described above may be performed by respectively adjusting the injection amounts and/or injection times of the source precursors using two separate injectors, or may be performed using a single injector having two channels. When the first and second source precursors are materials that do not react with each other, they may be injected through a single-channel injector where the first and second source precursors are allowed to mix together.

As the temperature of the semiconductor junction 10 is increased while exposed to the source precursors, electrical properties of the p-type oxide semiconductor may be improved. However, carbon may be mixed into the hole exnihilation layer 20 due to the pyrolysis of the source precursors. Therefore, in an exemplary embodiment, the source precursors may be applied in the state where the temperature of the semiconductor junction 10 is about 150° C. to about 350° C. Further, the semiconductor junction 10 may be exposed to the source precursors for about 0.1 second to about 3 seconds.

Subsequently, the semiconductor junction 10 may be re-exposed to the reactant precursors containing oxygen atoms. As such, the semiconductor junction 10 is alternately exposed to the source precursors and the reactant precursors so that an atomic layer can be formed by reaction of the source precursors and the reactant precursors chemically adsorbed on the surface of the semiconductor junction 10. Subsequently, residual substances or physically adsorbed molecules are removed through a pumping process to complete a cycle for forming the atomic layer.

In addition to the process illustrated in FIG. 5, a purge process and/or a pumping process may be further performed between the process of exposing the semiconductor junction 10 to the source precursors and the process of exposing the semiconductor junction 10 to the reactant precursors.

For example, a purge process may be performed using Ar gas for about 0.1 second to about 3 seconds after supplying the source precursors to remove the whole or a portion of the physically adsorbed source precursors. If the entire physical adsorption layer is removed, only the chemical adsorption layer remains. Consequently, one mono-atomic layer may be formed per cycle as a basic unit. Further, when a portion of the physical adsorption layer remains, the deposition speed per cycle may be faster than that of a pure atomic layer.

In still another exemplary embodiment, the hole exnihilation layer 20 may be configured as a composite layer in which the p-type oxide semiconductor and the photoactive material are formed as separate layers, respectively, as described above with reference to FIG. 3.

Referring to FIGS. 3 and 5, the cycle of ADL illustrated in FIG. 5 may be repeated. In some initial cycles, a first source precursor formed of Ni(dmamb)$_2$, Co(dmamb)$_2$, Cu(dmamb) or other suitable materials may be used as the source precursor. As a result, a first p-type oxide semiconductor layer 201 can be formed on the semiconductor junction 10. The number of cycles repeated may be determined based on the thickness at which the first p-type oxide semiconductor layer 201 is to be deposited.

In some subsequent cycles, a second source precursor formed of TDMAT, TDEAT, TEMAT or other suitable materials may be used as the source precursor. As a result, a photoactive layer 202 can be formed on the p-type oxide semiconductor layer 201. The aforementioned processes are repeated until a desired electrode structure is formed, thereby forming a hole exnihilation layer configured as a composite layer comprising at least one p-type oxide semiconductor layer and at least one photoactive layer.

In FIG. 5, the process forming the hole exnihilation layer 20 using ALD has been illustratively described. However, in the electrode structures according to exemplary embodiments, the method for forming the hole exnihilation layer 20 or other layers is not limited to the aforementioned ALD process. For example, depending on exemplary embodiments, one or more steps in the aforementioned ALD process may be omitted. Alternatively, the respective processes in the aforementioned ALD process may be performed in order and/or form different from those described herein.

Figure 4C:
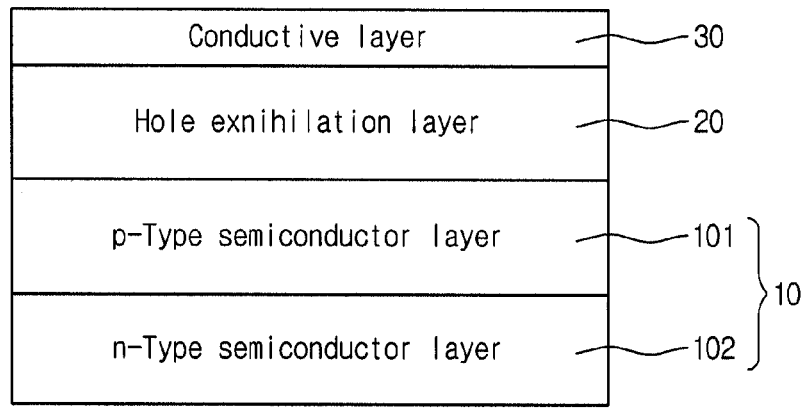

Referring to FIG. 4C, a conductive layer 30 may be formed on the hole exnihilation layer 20. In an exemplary embodiment, the conductive layer 30 may be formed by an ALD process in a manner similar to the manner the hole exnihilation layer 20 is formed. The ALD process for forming the conductive layer 30 may be identical to the ALD process of forming the hole exnihilation layer 20 except that the kinds of source precursors and reactant precursors are different. Hence, the detailed descriptions on the ALD process for forming the conductive layer 30 are omitted herein for the sake of brevity.

In an exemplary embodiment, the conductive layer 30 may be formed of Al. In this case, trimethylaluminum (TMA) ((CH$_3$)$_3$Al), dimethylaluminumhydride (DMAH) ((CH$_3$)$_2$AlH) or other suitable materials may be used as the source precursor. A material containing a hydrogen atom such as H$_2$ remote plasma or H* radical may be used as the reactant precursor. The reactant precursors containing hydrogen atoms may be used to allow an incubation phenomenon to be removed by activating the surface of the hole exnihilation layer 20.

For example, TMA may be used as the source precursor, and the hole exnihilation layer 20 may be heated at a temperature about 150° C. to about 350° C. Then, the source precursor is heated to a temperature of about 25° C. to about 70° C. to increase the vapor pressure to a point sufficient for depositing the conductive layer 30. In this case, the surface of the hole exnihilation layer 20 is first treated by H$_2$ remote plasma or the like. Then, the TMA may be injected. The injection time of the TMA may be about 0.1 second to about 3 seconds. An Ar purge process may be performed for about 0.1 second to about 3 seconds after the injection of the TMA to remove the entire or a portion of physically adsorbed molecules while leaving only chemically adsorbed TMA molecules intact. The Ar may be purged using a bubbling gas method. However, since the vapor pressure of the source precursors are sufficiently high, the Ar may be purged using a vapor draw method. Subsequently, $H_2$ remote plasma, H* radical or the like are injected for about 1 second to about 5 seconds, thereby forming an Al atomic layer. The conductive layer 30 with a desired thickness can be formed by repeating the aforementioned processes.

In another exemplary embodiment, the conductive layer 30 may be formed of Ni, Co or Cu. In this case, Ni(dmamb)$_2$, Co(dmamb)$_2$ or Cu(dmamb) may be used as the source precursor. Even if the conductive layer 30 formed of Ni, Co or Cu is oxidized in a subsequent process of forming a transparent electrode layer, these materials becomes a p-type oxide semiconductor such as NiO, CoO, $Cu_2O$, $CuAlO_2$ or $CuInO_2$. Therefore, the conductive layer 30 can perform functions similar to the hole exnihilation layer 20. The reactant precursor may include any one of $H_2$ remote plasma, $NH_3$ remote plasma, H* radical and the like.

In still another exemplary embodiment, the conductive layer 30 may be formed of Ru. In this case, the source precursor may include any one of ruthenium cyclopentadienyl, bis(ethylcyclopentadienyl)ruthenium, (2,4-dimethylpentadienyl)(ethylcyclopentadienyl)ruthenium and the like. The reactant precursor may include any one of $H_2$ remote plasma, $NH_3$ remote plasma, H* radical and the like.

Figure 4D:
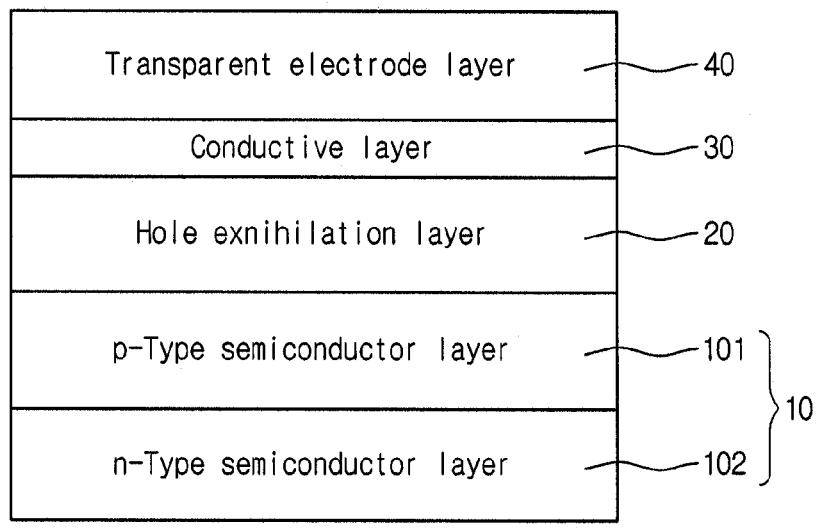

Referring to FIG. 4D, a transparent electrode layer 40 may be formed on the conductive layer 30. The transparent electrode layer 40 may be formed of a degenerated n-type oxide semiconductor. In an exemplary embodiment, the transparent electrode layer 40 may be formed by an ALD process in a manner similar to the manner the hole exnihilation layer 20 is formed. The ALD process for forming the transparent electrode layer 40 may be identical to that for forming the hole exnihilation layer 20, except that the kinds of source precursors and reactant precursors are different. Therefore, the detailed descriptions of the ALD process for forming the transparent electrode layer 40 are omitted herein for the sake of brevity.

In an exemplary embodiment, the transparent electrode layer 40 may be formed of ZnO. In this case, di-ethyl-zinc (DEZ) may be used as the source precursor, and $O_2$ remote plasma or the like may be used as the reactant precursor. In another exemplary embodiment, the transparent electrode layer 40 may be formed of ZnO:Al. In this case, DEZ and TMA may be used as the source precursor, and $O_2$ remote plasma or the like may be used as the reactant precursor.

The thickness of ZnO or ZnO:Al constituting the transparent electrode layer 40 may be about 50 nm to about 500 nm. In this case, the thickness of ZnO or ZnO:Al is relatively thick. Therefore, if a single reactor is used, it may take a long time to complete the deposition. Thus, a plurality of reactors arranged in sequence or similar arrangements may be used to deposit the transparent electrode layer 40. In order to increase a deposition speed, a method of depositing the transparent electrode layer 40 may be used so that O* radicals and source precursors are mixed in advance in a reactor by simultaneously injecting the source precursors into the reactor of $O_2$ remote plasma.

Figure 6:
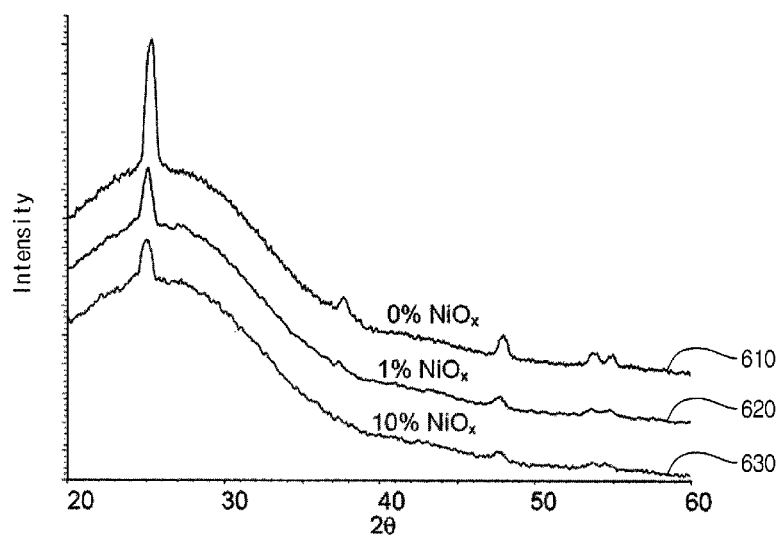
FIG. 6 is a graph illustrating X-ray diffraction patterns of a thin film formed of nickel oxide (NiO) and titanium oxide ($TiO_2$), according to an exemplary embodiment.

FIG. 6 is a graph illustrating X-ray diffraction patterns of a thin film formed of nickel oxide (NiO) and titanium oxide ($TiO_2$). In FIG. 6, patterns 610, 620 and 630 are respectively analysis results of annealing thin films at about 650° C. for about 30 seconds. Here, the thin films are respectively formed by mixing NiOs of about 0%, about 1% and about 10% with a $TiO_2$ thin film.

Referring to FIG. 6, note that although NiO of about 10% is added to the $TiO_2$ thin film, the tetragonal-anatase structure is maintained. As the analyzed result of electric conductivity illustrates, when a small amount of NiO is added to the $TiO_2$ thin film, the $TiO_2$ thin film exhibits properties of an n-type oxide semiconductor. However, when NiO of about 10% or more is added to the $TiO_2$ thin film, the $TiO_2$ thin film has properties of a p-type oxide semiconductor. Therefore, in an electrode structure according to an exemplary embodiment, the hole exnihilation layer configured as a composite layer comprising $TiO_2$ and NiO may be formed of $TiO_2$ having NiO of about 10% or more added thereto.

Figure 7:
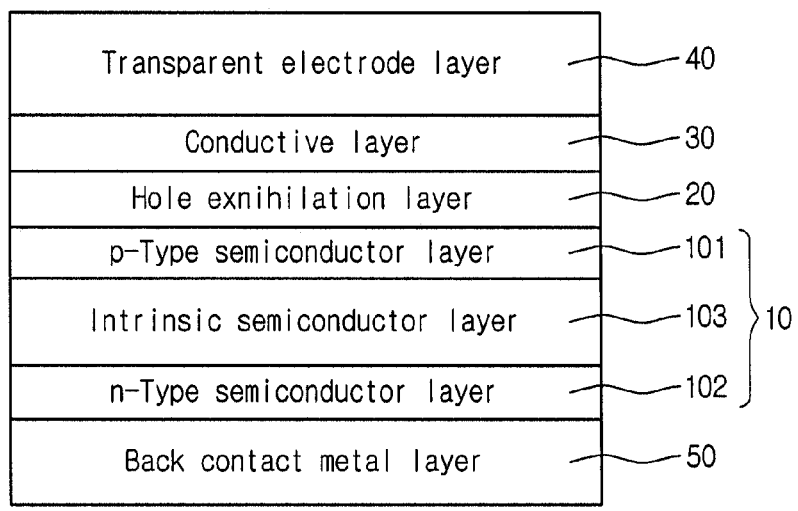
FIGS. 7 to 9 are schematic sectional views illustrating devices including electrode structures according to exemplary embodiments.
Figure 8:
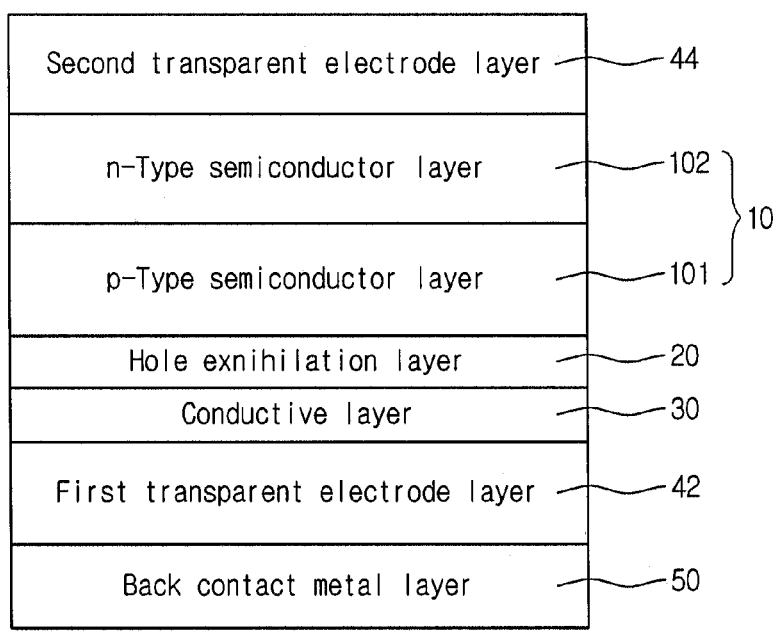
Figure 9:
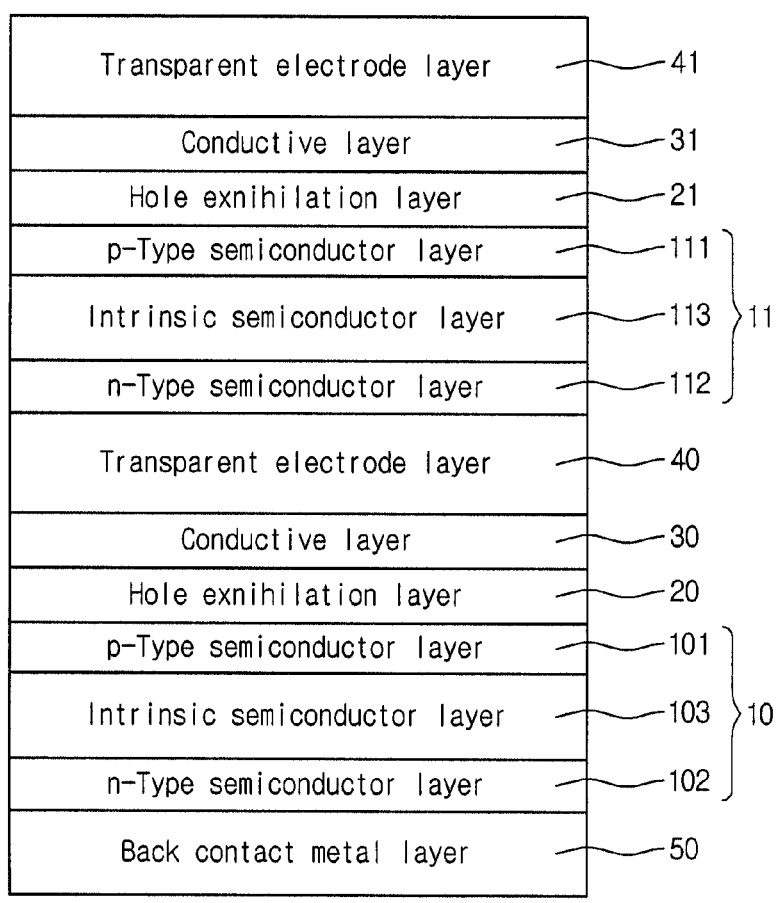

FIGS. 7 to 9 are schematic sectional views illustrating exemplary devices comprising electrode structures according to exemplary embodiments. FIG. 7 illustrates a device in which an electrode structure according to an exemplary embodiment is applied to a p-i-n type solar cell. Referring to FIG. 7, a back contact metal layer 50 may be positioned adjacent to an n-type semiconductor layer 102 of a semiconductor junction 10 comprising a p-type semiconductor layer 101, the n-type semiconductor layer 102 and an intrinsic semiconductor layer 103.

FIG. 8 illustrates a device in which an electrode structure according to an exemplary embodiment is applied to an n-p type solar cell. Referring to FIG. 8, in an n-p junction device, a back contact metal layer 50 may be first formed and a first transparent electrode layer 42 may then be formed on the back contact metal layer 50. When reflected light is not used in the solar cell, the first transparent electrode layer 42 may be redundant. A conductive layer 30 and a hole exnihilation layer 20 may be sequentially formed on the first transparent electrode layer 42. Subsequently, a semiconductor junction 10 comprising a p-type semiconductor layer 101 and an n-type semiconductor layer 102 is formed on the hole exnihilation layer 20, and a second transparent electrode layer 44 is formed on the second transparent electrode layer 44.

FIG. 9 illustrates a device in which an electrode structure according to an exemplary embodiment is applied to a tandem solar cell. Referring to FIG. 9, in the tandem solar cell having a plurality of semiconductor junctions 10 and 11 may be configured by forming hole exnihilation layers 20 and 21, conductive layers 30 and 31, and transparent electrode layers 40 and 41 as many as the number of the semiconductor junctions 10 and 11.

As described above, the electrode structures according to exemplary embodiments may be applied to transparent electrodes of solar cells. However, the electrode structures according to exemplary embodiments and methods for forming these structures may be applied not only to the solar cells but also to other different devices where the hole annihilation and the reduction of carrier generation efficiency is experienced during contact between an n-type transparent electrode with a p-type semiconductor. For example, the electrode structures according to exemplary embodiments may be applied to transparent semiconductor thin film devices.

By using an electrode structure according to an exemplary embodiment, a transparent electrode formed of a degenerated n-type oxide semiconductor does not come in direct contact with a p-type semiconductor. Thus, it is possible to reduce or prevent annihilation or recombination of holes generated in the p-type semiconductor by the n-type transparent electrode. As a result, the carrier generation efficiency is increased.

Further, the electric conductivity of the transparent electrode is increased by a conductive film, which improves electrical properties of a device.

While the present invention has been described in connection with certain exemplary embodiments, it is to be understood that the invention is not limited to the disclosed exemplary embodiments, but, on the contrary, is intended to cover various modifications and equivalent arrangements included within the spirit and scope of the appended claims, and equivalents thereof.

What is claimed is:

1. A method for forming an electrode structure, comprising:
    preparing a semiconductor junction comprising an n-type semiconductor layer and a p-type semiconductor layer in direct contact with the n-type semiconductor layer or with an intrinsic semiconductor layer sandwiched between the n-type semiconductor layer and the p-type semiconductor layer;
    forming a hole exnihilation layer on the p-type semiconductor layer, comprising:
        exposing the semiconductor junction to a source precursor; and
        exposing the semiconductor junction to a reactant precursor containing oxygen atoms; and
    forming a transparent electrode layer on the hole exnihilation layer,
    wherein at least one of the hole exnihilation layer or the transparent electrode layer is formed by atomic layer deposition.

2. The method according to claim 1, wherein the source precursor comprises any one selected from the group consisting of $Ni(dmamb)_2$, $Co(dmamb)_2$, $Cu(dmamb)$ and a combination thereof.

3. The method according to claim 1, wherein exposing the semiconductor junction to the source precursor comprises:
    exposing the semiconductor junction to a first source precursor comprising any one selected from the group consisting of $Ni(dmamb)_2$, $Co(dmamb)_2$, $Cu(dmamb)$ and a combination thereof; and
    exposing the semiconductor junction to a second source precursor comprising any one selected from the group consisting of tetra-dimethyl-amino-titanium, tetra-diethyl-amino-titanium, tetra-ethyl-methyl-amino-titanium and a combination thereof.

4. The method according to claim 3, wherein exposing the semiconductor junction to the first source precursor and exposing the semiconductor junction to the second source precursor are simultaneously performed.

5. The method according to claim 3, wherein exposing the semiconductor junction to the source precursor further comprises exposing the semiconductor junction to a reactant precursor, after exposing the semiconductor junction to the first source precursor and before exposing the semiconductor junction to the second source precursor.

6. The method according to claim 1, wherein the reactant precursor comprises any one selected from the group consisting of $O_2$, $N_2O$, $H_2O$, $O_3$, $O_2$ plasma, $N_2O$ plasma, $H_2O$ plasma, O* radical and a combination thereof.

7. The method according to claim 1, further comprising forming a conductive layer on the hole exnihilation layer after forming the hole exnihilation layer, wherein the transparent electrode layer is formed on the conductive layer.

8. The method according to claim 7, wherein the conductive layer is formed by atomic layer deposition.

9. The method according to claim 8, wherein forming the conductive layer comprises:
    exposing the hole exnihilation layer to a source precursor; and
    exposing the hole exnihilation layer to a reactant precursor containing hydrogen atoms.

10. The method according to claim 9, wherein the source precursor comprises any one selected from the group consisting of trimethylaluminum, dimethylaluminumhydride, $Ni(dmamb)_2$, $Co(dmamb)_2$, $Cu(dmamb)$, ruthenium cyclopentadienyl, bis(ethylcyclopentadienyl)ruthenium), (2,4-dimethylpentadienyl)(ethylcyclopentadienyl)ruthenium and a combination thereof.

11. The method according to claim 10, wherein the reactant precursor comprises any one selected from the group consisting of $H_2$ plasma, $NH_3$ plasma, H* radical and a combination thereof.

* * * * *